United States Patent
Bhalla et al.

(10) Patent No.: US 8,163,618 B2
(45) Date of Patent: Apr. 24, 2012

(54) POWER MOSFET DEVICE STRUCTURE FOR HIGH FREQUENCY APPLICATIONS

(75) Inventors: Anup Bhalla, Santa Clara, CA (US); Daniel Ng, Campbell, CA (US); Tiesheng Li, San Jose, CA (US); Sik K. Lui, Sunnyvale, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 12/658,450

(22) Filed: Feb. 9, 2010

(65) Prior Publication Data

US 2010/0148246 A1 Jun. 17, 2010

Related U.S. Application Data

(62) Division of application No. 11/125,506, filed on May 9, 2005, now Pat. No. 7,659,570.

(51) Int. Cl.
*H01L 21/336* (2006.01)
(52) U.S. Cl. ............... 438/268; 438/137; 438/273
(58) Field of Classification Search .......... 438/135–140, 438/268–284, E29.257, E21.418
See application file for complete search history.

(56) References Cited

U.S. PATENT DOCUMENTS

| | | | |
|---|---|---|---|
| 7,189,608 B2* | 3/2007 | Venkatraman et al. | 438/197 |
| 7,341,900 B2* | 3/2008 | Nakayama et al. | 438/176 |

* cited by examiner

*Primary Examiner* — Cuong Q Nguyen
(74) *Attorney, Agent, or Firm* — Bo-In Lin

(57) ABSTRACT

This invention discloses a new switching device supported on a semiconductor that includes a drain disposed on a first surface and a source region disposed near a second surface of said semiconductor opposite the first surface. The switching device further includes an insulated gate electrode disposed on top of the second surface for controlling a source to drain current. The switching device further includes a source electrode interposed into the insulated gate electrode for substantially preventing a coupling of an electrical field between the gate electrode and an epitaxial region underneath the insulated gate electrode. The source electrode further covers and extends over the insulated gate for covering an area on the second surface of the semiconductor to contact the source region. The semiconductor substrate further includes an epitaxial layer disposed above and having a different dopant concentration than the drain region. The insulated gate electrode further includes an insulation layer for insulating the gate electrode from the source electrode wherein the insulation layer having a thickness depending on a Vgsmax rating of the vertical power device.

6 Claims, 16 Drawing Sheets

POWER MOSFET DEVICE STRUCTURE FOR HIGH FREQUENCY APPLICATIONS

This patent application is a Divisional application of a application Ser. No. 11/125,506 filed on May 9, 2005 now U.S. Pat. No. 7,659,570. The Disclosures made in the patent application Ser. No. 11/125,506 are hereby incorporated by reference.

BACKGROUND OF THE INVENTION

1. Field of the Invention

The invention disclosed herein relates generally to the device configuration and fabrication process of semiconductor switching devices. More particularly, this invention relates to a novel and improved device configuration and fabrication process for providing high frequency power switching devices.

2. Description of the Prior Art

As there is an ever growing demand for high frequency switch power devices, conventional device configurations and manufacturing processes of power switching devices are still limited by speed-limiting capacitance between the gate and drain of the power transistors, e.g., MOSFET and IGBT. There is an urgent need to overcome such limitations especially when high frequency switching power supplies are providing power to wide range of electronic devices.

Referring to FIGS. 1A to 1D for conventional techniques wherein FIGS. 1B and 1D show a reduction of the gate-drain capacitance for the typical planar and trenched DMOS cell of FIGS. 1A and 1C respectively. Specifically, a terrace gate dielectric layer that is thicker than regular gate oxide layer is formed under a terrace gate. The gate-drain capacitance is reduced because there is a thicker terrace gate oxide layer between the gate and the drain. For a trenched DMOS cell shown in FIG. 1D, similarly, a thicker gate oxide layer is formed at the bottom of the trench to reduce the gate-drain capacitance. However, such device configurations still have problems and limitations. One problem with the terrace gate-oxide design is that the process is not self-aligned; therefore it is hard to reduce the cell size. In carrying out the process of forming the terraced gate the terrace dielectric and gate electrode are subject to lithographic misalignment. The size of the device is increased due to a requirement to allow for misalignment tolerance between the terraced gate and the terrace dielectric layer. A second problem for this design is that the thick terrace dielectric layer reduces the accumulation of carrier in the drain area under the dielectric terrace and this increases the Rdson of the device. Furthermore, the reduction of Crss is limited by the thickness of the terrace dielectric. This is especially true for the thick trench bottom oxide approach in trench device where the thick bottom oxide is hard to make. The increase of oxide thickness in the trench bottom also reduces the accumulation of carriers in the drain region under the thick oxide hence increase the device on-resistance Rdson.

In another patented invention U.S. Pat. No. 5,894,150, Hshieh et al. disclose a split gate configuration to achieve a purpose of reducing the gate-drain capacitance. The gate of a DMOS cell is split into two segments as that shown in FIG. 1E. The split gate configuration reduces the gate-drain capacitance because it eliminates the contribution to the gate-drain capacitance from the gate-drain overlapping areas. It is clear that the split gate configuration disclosed by Hshieh does achieve gate-drain capacitance reductions. However, with the split gate configuration, there are still some fringing electric field couplings between the gate electrodes to the epitaxial layer connecting to the drain electrode. Further improvements are still required to eliminate the fringing capacitance resulted from such couplings between the gate and the drain.

Baliga disclosed in U.S. Pat. No. 5,998,833 another DMOS cell as that shown in FIG. 1F to reduce the gate-drain capacitance by placing the source electrode underneath a trenched gate. There are some shielding effects provided by the source electrode underneath the trenched gate. However, similar to a configuration as that shown in FIG. 1E, there are still fringing capacitance between the gate electrodes and the epitaxial layer connected to the drain electrode. Therefore, further improvements are still required to further reduce the gate-drain capacitance such that further improvements of high frequency switching performance can be achieved.

Therefore, a need still exists in the art to provide an improved device configuration and manufacturing methods to provide MOSFET device with further reduced gate-drain capacitance such that the above-discussed limitations as now encountered in the prior art can be resolved.

SUMMARY OF THE PRESENT INVENTION

It is therefore an object of the present invention to provide an improved MOSFET device with a reduced gate-drain capacitance by first reducing the gate-drain overlapping area with a specially configured gate. The gate is patterned as split gate with interposing bore for depositing a source metal into the interposing cavity. The gate is further insulated with dielectric layer having a predefined thickness to reduce the input and feedback capacitance to improve the transient efficiency for better switching performance.

Specifically, it is an object of the present invention to provide an improved MOSFET device with a novel configuration by interposing a source metal into a gate electrode for achieving dual purposes of reducing the overlapping area between the gate and drain and to preventing electric field coupling between the gate and the epitaxial layer underneath the gate thus significant reduce the gate to drain capacitance. Higher switching speed and reduced transient losses are achieved with the improved switching device disclosed in this invention.

Briefly in a preferred embodiment this invention discloses a vertical power device supported on a semiconductor that includes a drain disposed on a first surface and a source region disposed near a second surface of the semiconductor opposite said first surface. The vertical power device further includes an insulated gate electrode disposed on top of the second surface for controlling a source to drain current. A source electrode is interposed into the insulated gate electrode for substantially preventing a coupling of an electrical field between the gate electrode and an epitaxial region underneath the insulated gate electrode. The source electrode further covers and extends over the insulated gate for covering an area on the second surface of the semiconductor to contact the source region. The semiconductor substrate further includes an epitaxial layer disposed above and having a different dopant concentration than the drain region. The insulated gate electrode further includes an insulation layer for insulating the gate electrode from the source electrode wherein the insulation layer has a thickness that is depending on a Vgsmax rating of the vertical power device. In another preferred embodiment, the insulated gate electrode further includes an insulation layer for insulating the gate electrode from the source electrode and the insulation layer has a greater thickness surrounding an outer edge of the gate electrode for allowing an alignment tolerance for etching a contact opening. In a preferred embodiment, a vertical power device further includes an N-channel MOSFET cell. In another preferred embodiment, a vertical power device further includes a P-channel MOSFET cell.

This invention further discloses a method for manufacturing a power MOSFET device. The method includes a step of forming a body region and a source region in a semiconductor followed by depositing a gate layer on top of the semiconductor. The method further includes a step of applying mask for patterning a plurality of gates with the mask providing an opening for etching an interposing bore in the gates for allowing a layer of source metal to interpose into the gates. The method further includes a step of depositing a metal layer over a plurality of patterned gates followed by a step applying a metal mask for patterning a gate metal and a source metal with the source layer interposing into the gates.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 6D-1 to 6F-1 are a series of cross sectional views for illustrating alternate processes for manufacturing an alternate MOSFET device of this invention.

FIGS. 7F-1 to 7G-1 are a series of cross sectional views for illustrating alternate processes for manufacturing another alternate MOSFET device of this invention.

DETAILED DESCRIPTION OF THE METHOD

Figure 2:
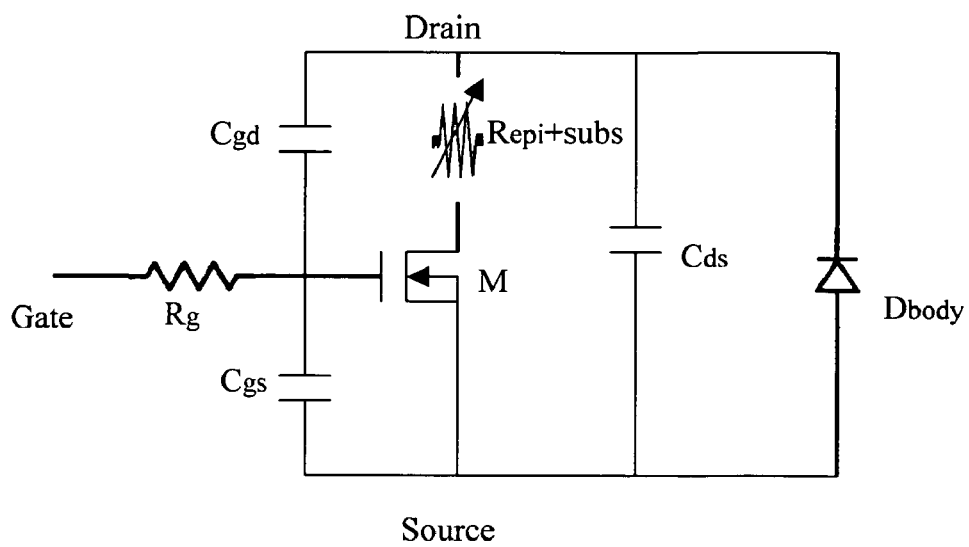
FIG. 2 shows an equivalent circuit of a power MOSFET.

Referring to FIG. 2 for an equivalent circuit of a MOSFET device M includes a gate, drain and source electrodes wherein the gate has a gate resistance Rg and there is an adjustable resistance over the epitaxial layer and the substrate connected to the drain electrode. A PN diode, e.g., Dbody, is formed across the body layer. There are capacitors between three electrodes, i.e., Cgs between the gate and the source, Cgd between the gate and the drain and Cds between the drain and the source. In the power MOSFET parlance, the input capacitance Ciss, feedback capacitance Crss and output capacitance Coss are determinate by the follows:

$$Ciss = Cgd + Cgs$$

$$Crss = Cgd$$

$$Coss = Cds + Crss$$

The input capacitance Ciss is inversely proportional to the achievable maximum frequency the MOSFET device can operate. Therefore, in order to increase the operation frequency, a design approach is to reduce the input capacitance Ciss.

Furthermore, the input capacitance Ciss and the feedback capacitance Crss also determine the efficiency of the MOSFET device by affecting the device operation characteristics during a switching transient. Higher capacitance increases the switching transient time therefore increases the switching loss. Therefore, it is desirable to reduce the input capacitance and the feedback capacitance.

Figure 3A:
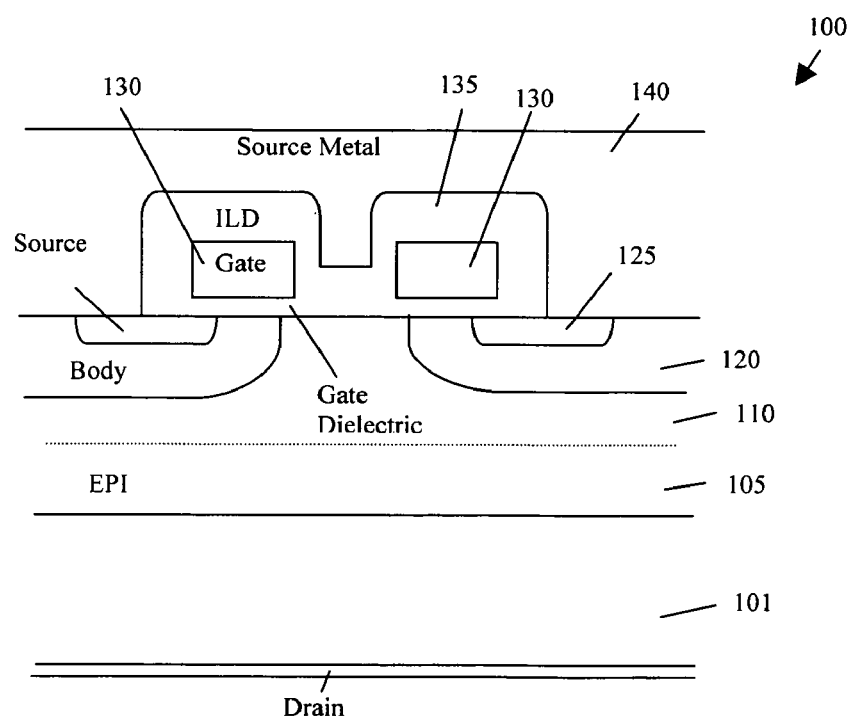
FIGS. 3A and 3B are two alternate cross sectional views of improved planar MOSFET with a source electrode penetrating into a space surrounded by a polysilicon gate of this invention.

Referring to FIG. 3A for a planar MOSFET cell 100 as a preferred embodiment of this invention. The MOSFET cell 100 is formed in a semiconductor substrate 101 with a drain region of a first conductivity type, e.g., an N+ substrate, formed at a bottom surface. The planar MOSFET cell is formed on top of an epitaxial layer 105 of a first conductivity type, e.g., N- epi-layer that having a lower dopant concentration than the substrate. A body region 120 of a second conductivity type, e.g., a P-body region 120, is formed in the epi-layer 105 and the body region 120 encompasses a source region 125 of the first conductivity type, e.g., N+ source region 125. Each MOSFET cell 100 further includes a polysilicon gate 130 disposed on top of a portion of body region 120 and extending over a portion of source region 125 and a portion of drain region 110. Furthermore, a gate dielectric layer 135 is formed to surround the gate 130. Alternatively, a first conductivity type dopant may be implanted into the top EPI region 110 to increase dopant concentration before MOSFET cells are formed. The higher dopant concentration improves the conductivity of the MOSFET.

Unlike the conventional MOSFET cell, the gate is now formed with split segments. Each segment is surrounded by the gate dielectric layer 135. Furthermore, the space between the gate segments 130 that extended above the epitaxial layer 105 between the source regions is filled with a source metal layer 140. The source metal 140 is electrically connected to the source regions 125 and further provide as a shield to shield the gate segments 130 from the epitaxial layer 105. For the purpose of further reducing the gate-drain capacitance Cgd, the dielectric layer 135 is thinned with the source metal 140 introduced between the split segments of the gate electrode 130. The fringing field from the gate 130 to terminate at the epitaxial layer 105 in the conventional MOSFET cells as discussed above is now terminated at the source metal 140 now disposed between the space extended across the split gate 130. The source metal 140 is held at a fixed DC potential in most applications thus shielding the gate from the large swings of the drain potential. The value of the Crss is therefore dramatically reduced. As will be further discussed below, the thick oxide layer 135 surrounding the gate 130 as that shown in FIG. 3A is to provide enough alignment tolerance for opening the contact.

Figure 1A:
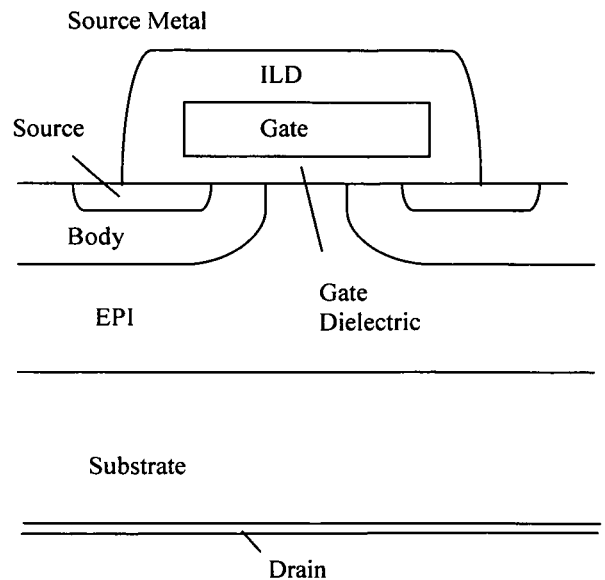
FIG. 1A is a cross sectional view of a basic planar DMOS FET cell.
Figure 1B:
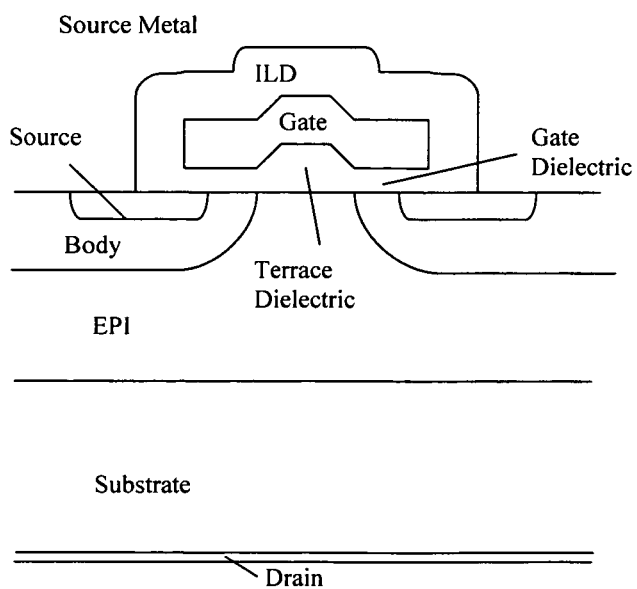
FIG. 1B is a cross sectional view of a basic planar DMOS FET cell with a terrace gate.
Figure 1C:
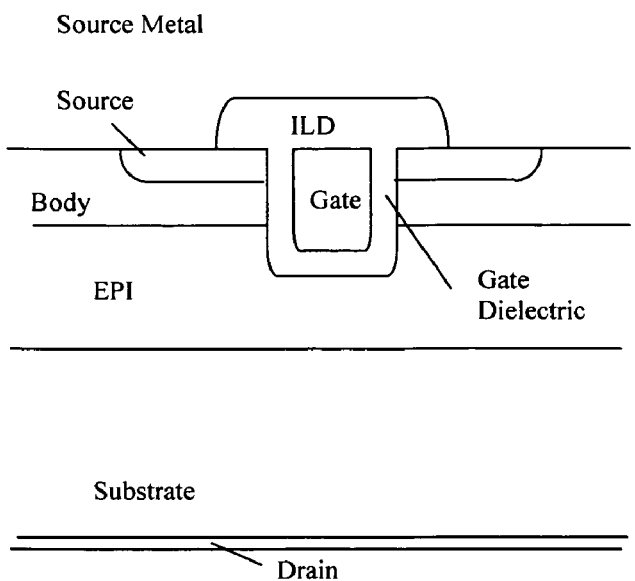
FIG. 1C is a cross sectional view of a basic trenched DMOS FET cell.
Figure 1D:
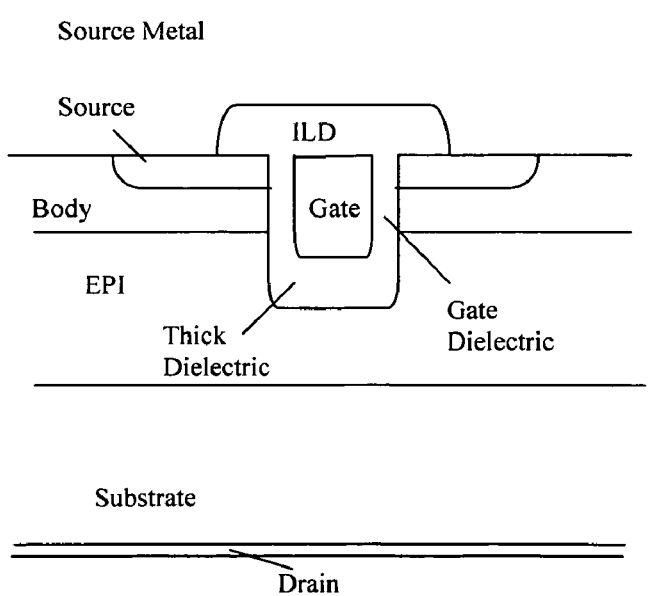
FIG. 1D is a cross sectional view of a basic trenched DMOS FET cell with a thick oxide layer at the bottom of the trench.
Figure 1E:
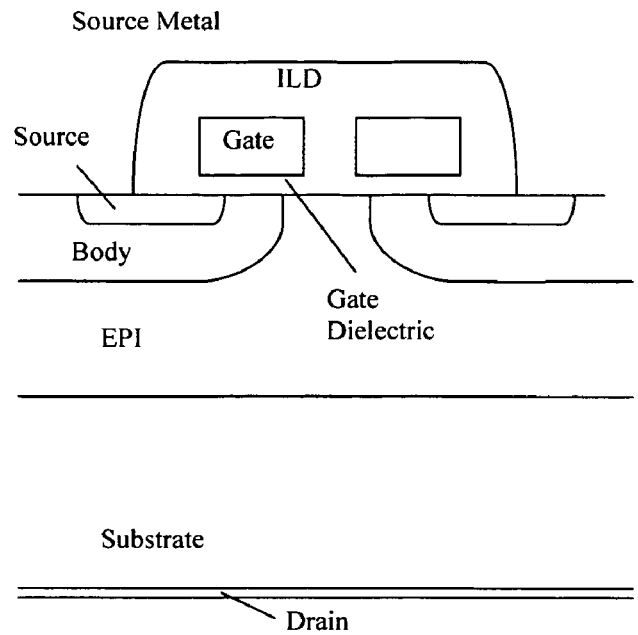
FIG. 1E is a cross sectional view of a planar MOSFET cell with a split polysilicon gate.
Figure 1F:
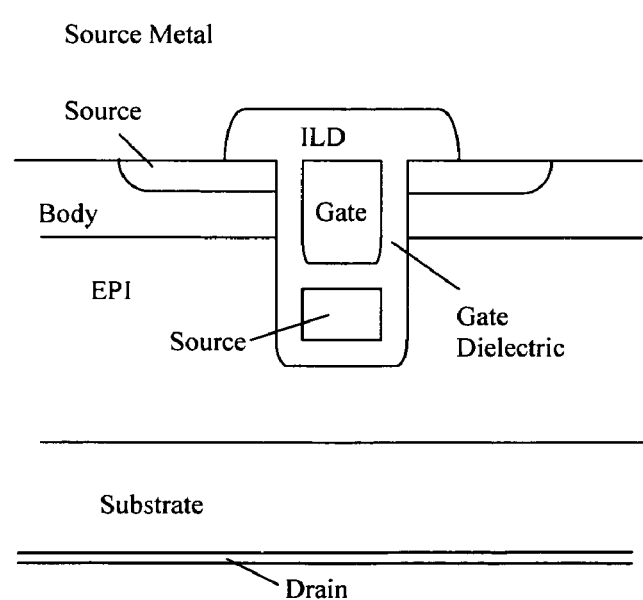
FIG. 1F is a cross sectional view of a MOSFET cell with a shielded trench gate.
Figure 3B:
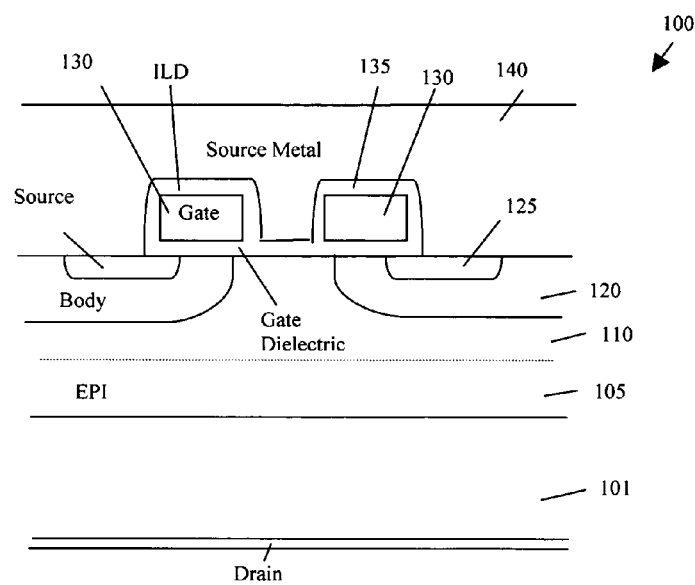

The structure in FIG. 3B employs only a thin inter-layer dielectric (ILD) 135' to deliberately increase the input capacitances in applications where a low ratio of Crss/Ciss is desirable, such as in synchronous FETs, or in bridge applications. Thus, not only is the value of Crss dramatically reduced, but the value of Cgs, and therefore Ciss is significantly increased. Unlike the terraced gate dielectric process shown in FIG. 1B where the size of device is limited by the lithographic misalignment between the terrace dielectric and the gate electrode, the cell structure of FIGS. 3A and 3B does not suffer from this drawback. Furthermore, while the control of gate capacitance depends on the critical dimensional (CD) control of the terraced oxide and the gate electrode in the structure of FIG. 1B, control of the gate capacitance is simplified in this invention. The gate capacitance according to a configuration shown in FIGS. 3A and 3B depends only on the dimension of the gate electrode. The thickness of the ILD 135 or 135' between the gate and source metal disposed above the gate and to the left and to the right of the gate is set by the maximum gate-source voltage rating. This gate-source voltage rating also sets the minimum gate dielectric thickness. However, this minimum thickness of gate dielectric layer may not be practical for many high-speed applications because thin oxide layers increase the capacitance Cgs therefore increase the input capacitance Ciss, which eventually decrease the maximum operable frequency. In FIG. 3B, the minimum ILD thickness is constrained by the quality of the films, grown or deposited, the interface with the gate electrode, the radius of curvature of the gate electrode top corners, and the interface with the source metal. Therefore, on the one hand, the thickness of the dielectric in the region between the two Polysilicon gates and the interposed source electrode suppresses Crss is better when it is thin. However, this must be balanced against the fact that a thin dielectric here raises Ciss and Coss, and is ultimately limited by the Vgsmax rating of the device.

According to FIGS. 3A and 3B, and above descriptions, this invention discloses a metal oxide semiconductor field effect transistor (MOSFET) cell supported on a semiconductor substrate. The MOSFET cell further includes an insulated gate electrode 130 disposed on top of and extending over an epitaxial region 105 of the semiconductor substrate surrounded by a body region 120 of the MOSFET cell 100. The MOSFET cell further includes a source electrode 140 interposed into the insulated gate electrode 130 and disposed above the epitaxial region 110 for substantially preventing a coupling of an electrical field between the gate electrode 130 and the epitaxial region 105. In a preferred embodiment, the source electrode 140 further extends over the insulated gate 135 for contacting a source region 125 encompassed in the body region 120. In a preferred embodiment, the semiconductor substrate further includes a drain region 105 disposed below and having a different dopant concentration than the epitaxial region 105. In another preferred embodiment, the insulated gate electrode 130 further comprising an insulation layer 135 for insulating the gate electrode 130 from the source electrode 140 wherein the insulation layer 135 having a thickness depending on a Vgsmax rating of the MOSFET cell 100. In a preferred embodiment, the insulated gate electrode 130 further includes an insulation layer 135 for insulating the gate electrode 130 from the source electrode 140 wherein the insulation layer 135 having greater thickness surrounding an outer edges of the gate electrode for allowing an alignment tolerance for etching a contact opening. In a preferred embodiment, the MOSFET cell 100 further comprises an N-channel MOSFET cell. In a preferred embodiment, the MOSFET cell 100 further comprises a P-channel MOSFET cell.

Figure 4A:
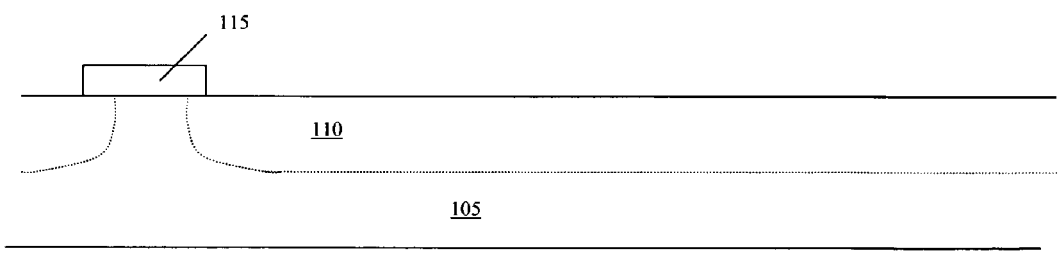
FIGS. 4A to 4E are a series of cross sectional views for illustrating the processes for manufacturing a MOSFET device of this invention.
Figure 4B:
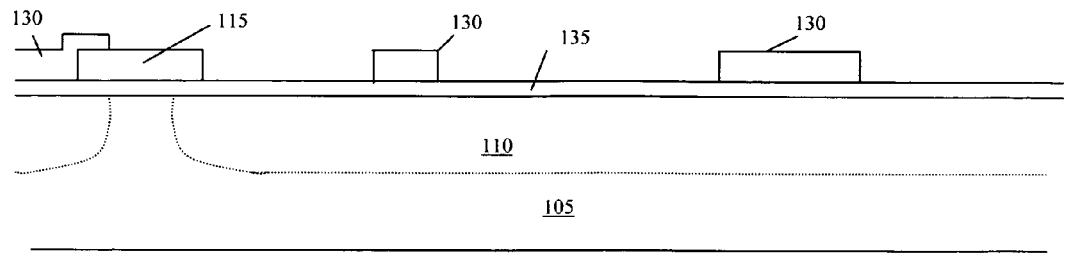
Figure 4C:
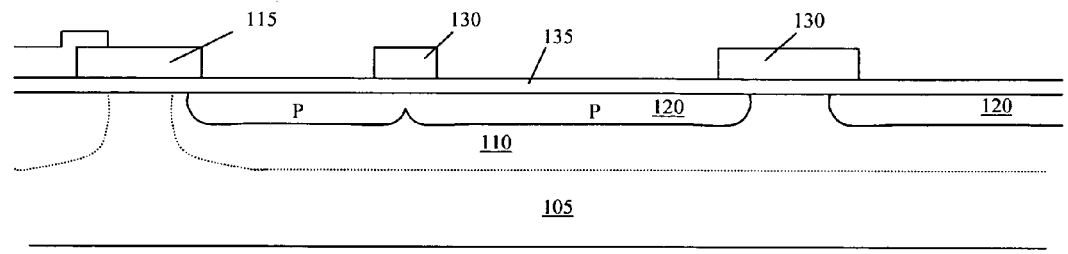
Figure 4D:
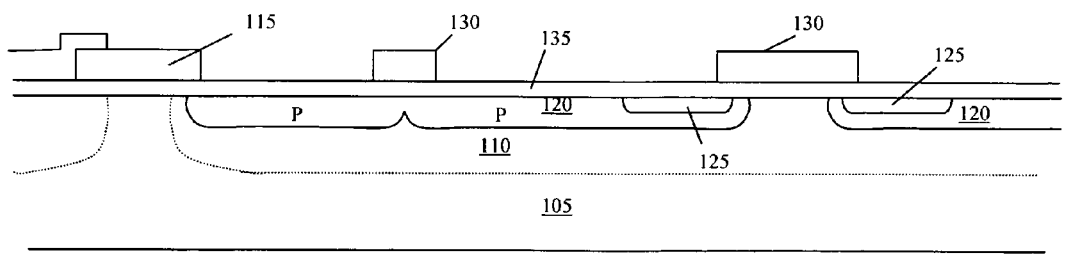
Figure 4E:
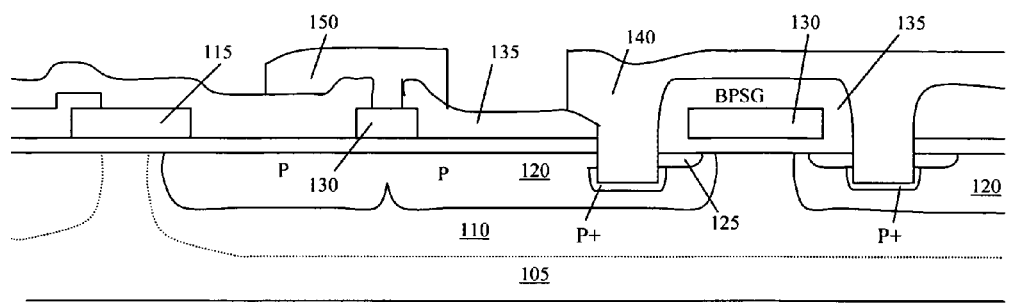

Referring to FIGS. 4A to 4E for a basic "poly first" processing steps for fabrication of a planar MOSFET. In FIG. 4A, the fabrication process starts by growing an initial oxide layer 115 on a top surface of N− epi layer 105 which is in turn grown on a N+ substrate (not shown). An active mask is applied to etch a portion of the oxide layer 115 to define an active area followed by an N-type JFET (junction field effect transistor) ion implant, e.g., an arsenic implant, and applying an elevated temperature to drive down the N region 110 into the EPI 105. In FIG. 4B, a gate oxide layer 135 is grown first. Then, a polysilicon layer 130 is formed followed by applying a poly mask to define a plurality of polysilicon gate 130 on the top surface. In FIG. 4C, a body implant with P-type ions is carried out followed by a body diffusion for driving the P-body region 120 with an elevated temperature. In FIG. 4D, a source mask is applied to carry out an N-type ion source implant followed by source diffusion to form the N+ source regions 125. The N+ implant and drive processes may be carried out either with or without a mask. A Mask may be used to pattern the N+ area within the cell, and keep it away from the device periphery. In FIG. 4E, an inter-layer dielectric layer 135', e.g., a BPSG layer, is deposited on the top surface followed by applying a special contact mask to carry out a contact etch to remove specific portions of the inter-layer dielectric layer 135'. A metal layer 140 is then deposited on top followed by applying a metal mask for defining the source metal 140 and the gate metal 150 respectively. A metal alloy or silicidation of contacts can be applied preceding this step. The fabrication process proceeds with passivation layer deposition and patterning if passivation is required for providing necessary reliability. The top surface may now be solder plated for solder attachment, if that is the method of connecting to the source leads. The fabrication processes is completed with backside grinding and metal deposition to complete the structure. An implant may be used in the back to improve contact and an alloying step may be performed if needed.

Figure 5A:
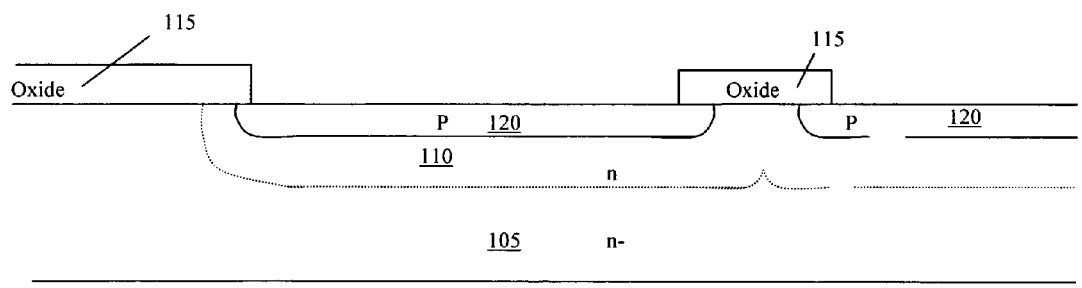
FIGS. 5A to 5E are a series of cross sectional views for illustrating alternate processes for manufacturing a MOSFET device of this invention.
Figure 5B:
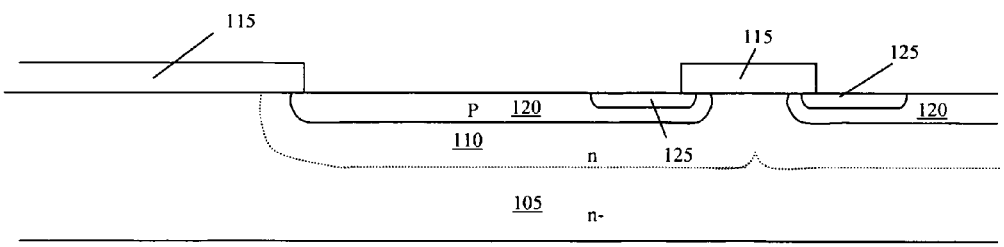
Figure 5C:
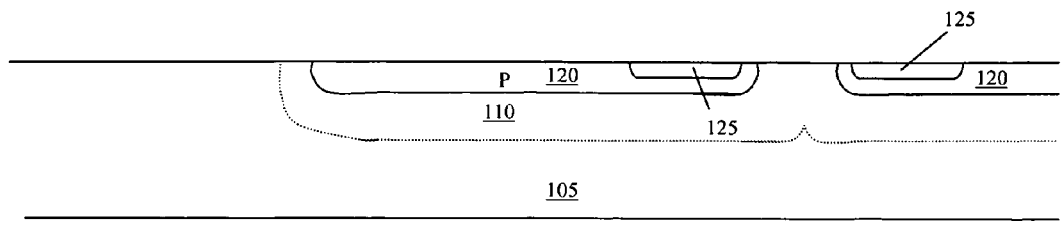
Figure 5D:
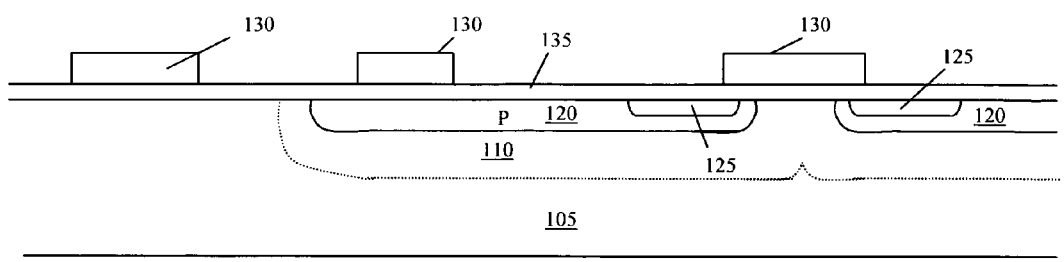
Figure 5E:
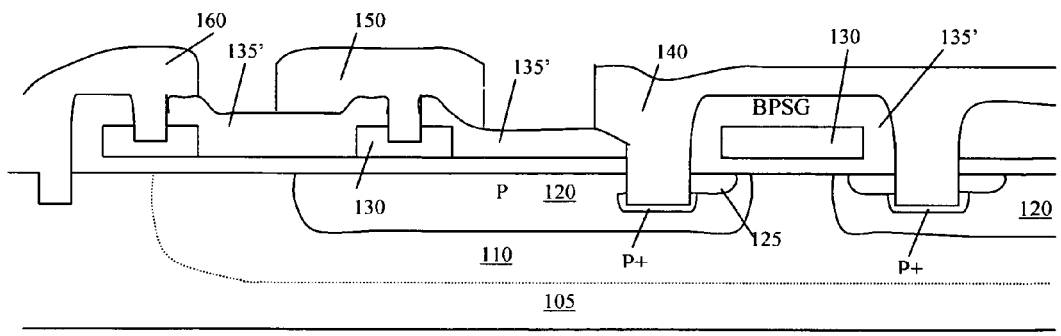

Referring to FIGS. 5A to 5E for an alternate "poly-last" process flow to fabricate a basic DMOS cell. In FIG. 5A, the fabrication process starts by growing an initial oxide layer 115 on a top surface of an N− epi layer 105. An active mask is applied to etch a portion of the oxide layer 115 to define the implant block for the active cells and the termination guard rings. The fabrication process continues with an N-type JFET (junction field effect transistor) ion implant, e.g., an arsenic implant, and a P-type ion implant to form the body region. A mask may be needed to keep the body implant out of the channel stop area of the termination. A diffusion process is then carried out to diffuse and drive the N+ source region 110 and the p-body region 120 into the EPI 105. In FIG. 5B, a source mask is applied to carry out an N-type ion implant to define a plurality of N+ source regions 125. The source implant mask is used to pattern the N+ area within the cell, and keep it away from the device periphery. In FIG. 5C, a mask is employed to strip off the oxide layer 115 from the active area. Alternatively blanket wet etch process may be used if oxide is not needed in the termination top surface. In FIG. 5D, a gate oxide layer 135 is first grown followed by depositing a polysilicon layer 130 and patterning the polysilicon layer into a plurality of polysilicon gate 130 for the DMOS cells and to form gate bus and the termination structure. It may use a Poly/Silicide stack, or Poly/W film with this process for low resistance gate electrodes. Alternatively, a salicide process using a spacer between gate and source may be incorporated at this point. In FIG. 5E, an inter-layer dielectric layer 135', e.g., a BPSG layer, is deposited on the top surface followed by applying a contact mask to remove portions of the passive layer 135' to provide openings on the passivation layer 135' to allow for contact to the source regions 125 and the gates 130. The contact mask is further configured to remove a middle portion between the gates 130 such that the source metal 140 is disposed immediately next to the gate-insulating layer 135' wherein the gate 130 provides a central opening to allow a source metal 140 to penetrate therein. A metal layer is then deposited on top followed by applying a metal mask for defining the source and gate metal 140 and 150 respectively. As shown in FIG. 5E, the termination area further provides with a channel stop where a drain metal 160 penetrates into an etched open space of a polysilicon layer 130-T by applying the contact mask in the termination area The fabrication process is completed with passivation layer deposition followed by a passivation etch and a backside metal deposit process similar to that described for FIG. 4E.

Figure 6A:
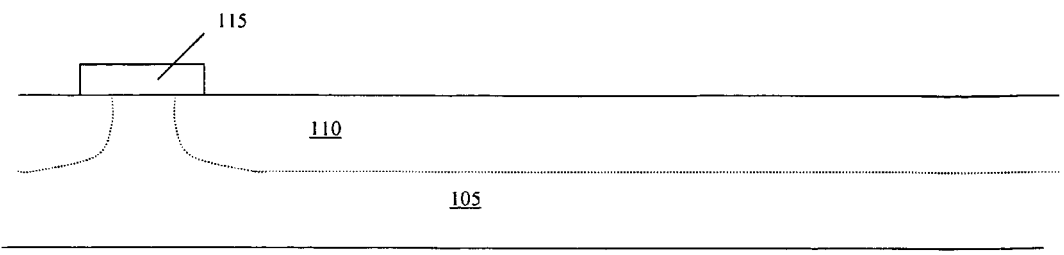
FIGS. 6A to 6G are a series of cross sectional views for illustrating alternate processes for manufacturing an alternate MOSFET device of this invention.
Figure 6B:
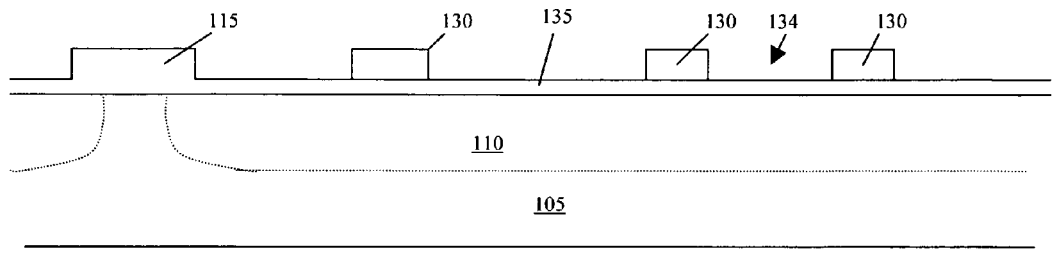
Figure 6C:
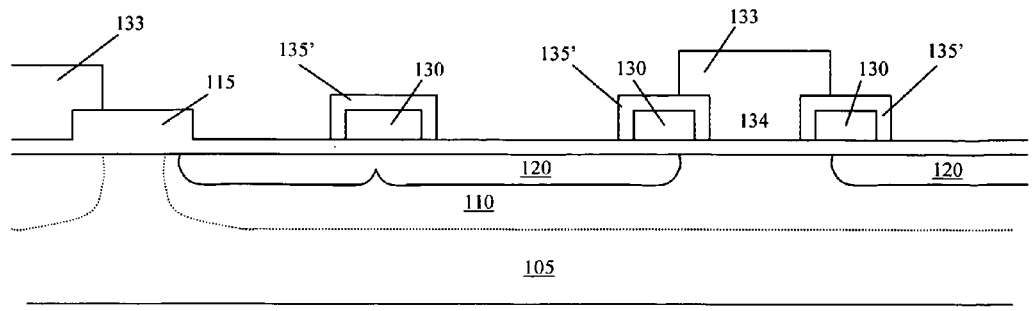
Figure 6D:
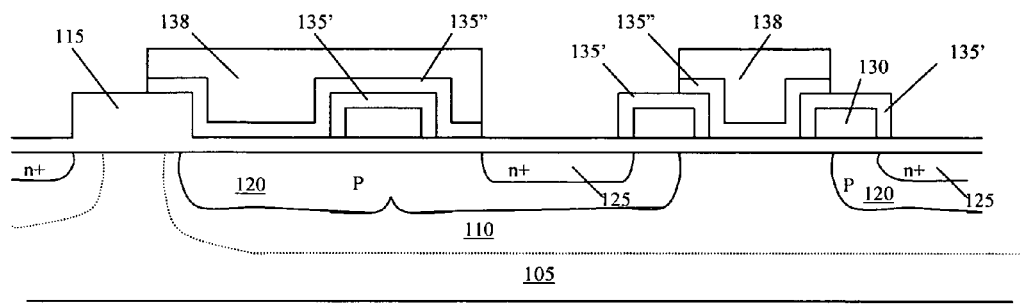
Figure 6E:
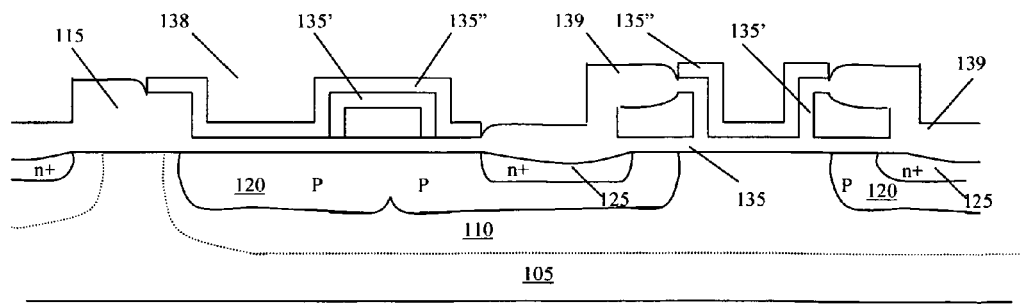
Figure 6F:
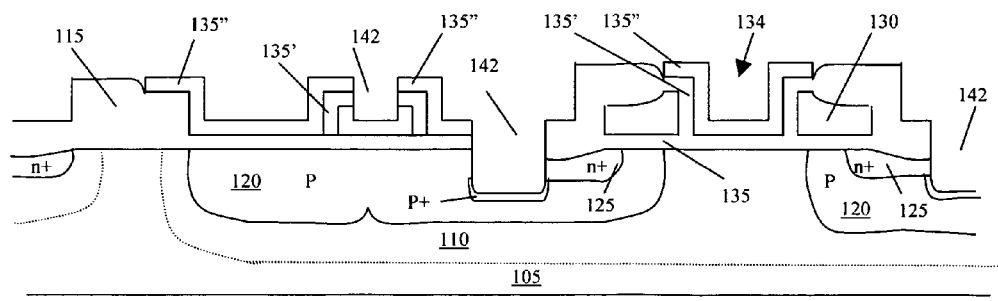
Figure 6G:
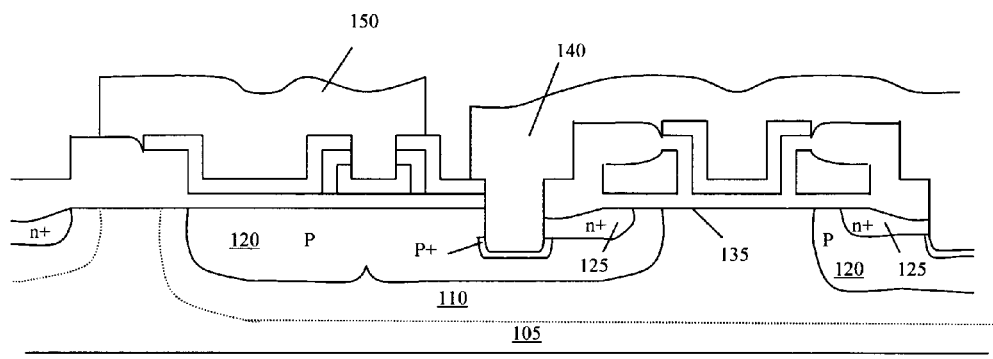

Referring to FIGS. 6A to 6G for an alternate "poly-first" process flow to fabricate a planar MOSFET of this invention. In FIG. 6A, the fabrication process starts by growing an initial oxide layer 115 on a top surface of N− Epi substrate 105. An active mask is applied to etch a portion of the oxide layer 115 to define an active area followed by an N-type JFET (junction field effect transistor) ion implant, e.g., an arsenic implant, and applying an elevated temperature to drive down the N region 110 into the substrate 105. In FIG. 6B, a gate oxide layer 135 is shown that is grown through a thermal oxidation process. Then, a polysilicon layer 130 is formed followed by applying a poly mask to define a plurality of polysilicon gate 130 on the top surface. In FIG. 6C, a body implant with P-type ions is carried out with special body block 133 to keep the body dopants out of the gap 134 in the poly layer 130. The process proceeds with a body diffusion for driving the P-body region 120 with an elevated temperature. A thin oxide layer 135' covering the top surface is grown during the body diffusion process. In FIG. 6D, a thin nitride layer 135" is deposited over the top surface. A source mask 138 is applied to etch the thin nitride layer then carry out an N-type ion source implant followed by source diffusion to form the N+ source regions 125. As shown in FIG. 6D, the mask 138 also keeps the source dopants out from the polysilicon gap 134. In FIG. 6E, an oxidizing source drive is used to grown a thicker oxide 139 with a thickness of approximately 500 A-5000 A in the regions not covered by nitride. This oxide will serve as the interlayer dielectric, so a deposited film is no longer needed. In FIG. 6F, contacts 142 are opened and patterned to the active cell and gate poly 130. The P+ contact implant is performed it is shallow enough not to penetrate the oxide-nitride-oxide (ONO) stack in the area 134 between the poly gate segments 130. A mask will be needed if the contact implant energy will cause the dopant to penetrate through this dielectric layer. In FIG. 6G, the metal is deposited, on the device and patterned to form the source metal 140 and gate metal 150. The fact that the dielectric layer 135' and 135" separating the gate poly 130 from the interposed shielding source electrode 140 is an ONO stack improves the device reliability. In the above process, nitride layer may be left over much of the termination if it is desirable for enhancing reliability. This may allow one to skip the final passivation step.

Figures 1, 6D:
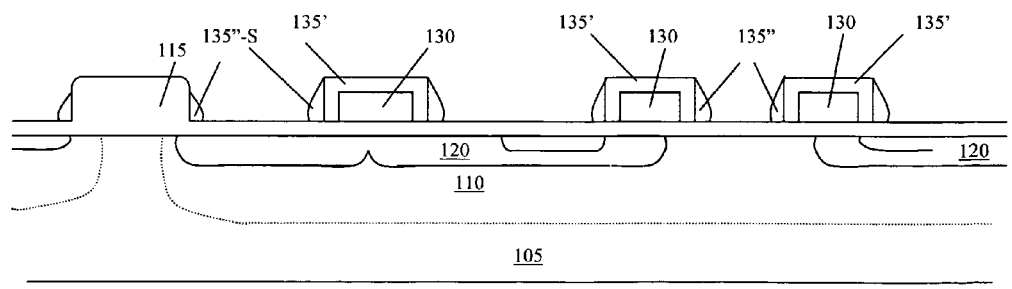
Figures 1, 6E:
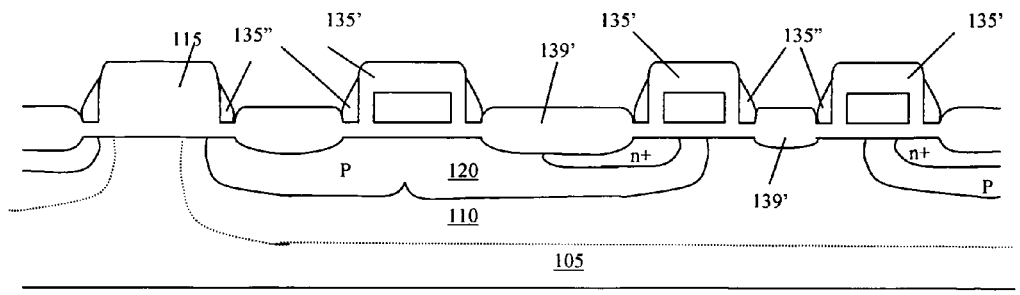
Figures 1, 6F:
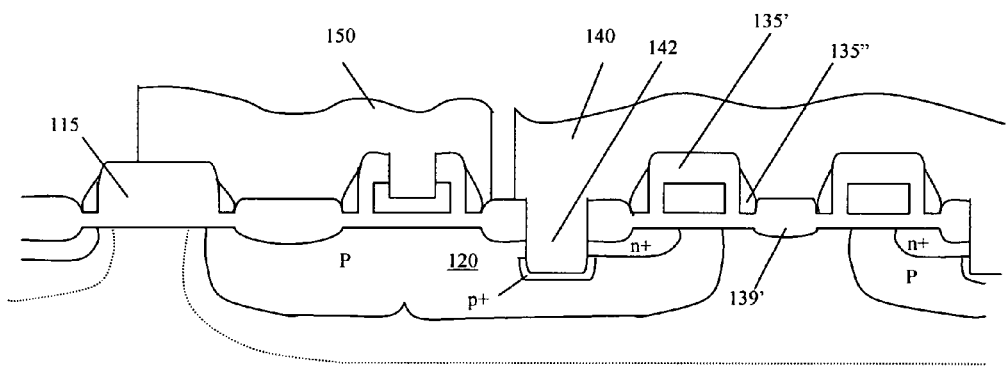

Referring to FIG. 6D-1 as an extension of the process shown in FIG. 6D where a nitride spacer 135"-S formed around the edges of the gate 130. In FIG. 6E-1, an oxide layer 139' between the nitride spacer 135"-S is formed during a source diffusion process with an elevated temperature. This oxide will serve as the interlayer dielectric, so a deposited film is no longer needed. In FIG. 6F-1, contacts 142 are opened and patterned to the active cell and gate poly 130. The P+ contact implant is performed as a shallow implant not to penetrate the oxide layer 139' between the poly gate segments 130. The processes as shown in FIG. 6D-1 to 6F-1 are simple extension of the processes shown in FIGS. 6D to 6F to use a nitride spacer formed only on the poly edges instead of a poly film. This spacer may be formed after the body drive or after source implant.

Figure 7A:
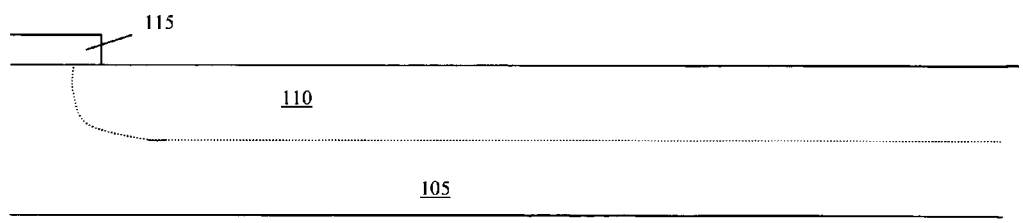
FIGS. 7A to 7G are a series of cross sectional views for illustrating alternate processes for manufacturing another alternate MOSFET device of this invention.
Figure 7B:
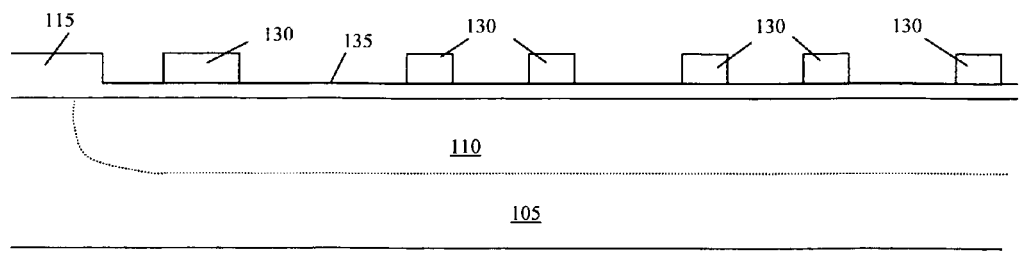
Figure 7C:
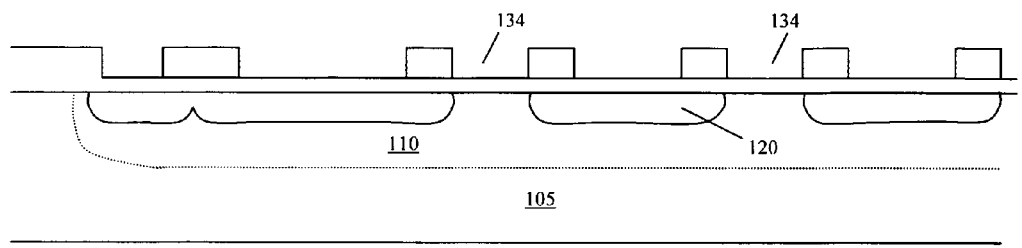
Figure 7D:
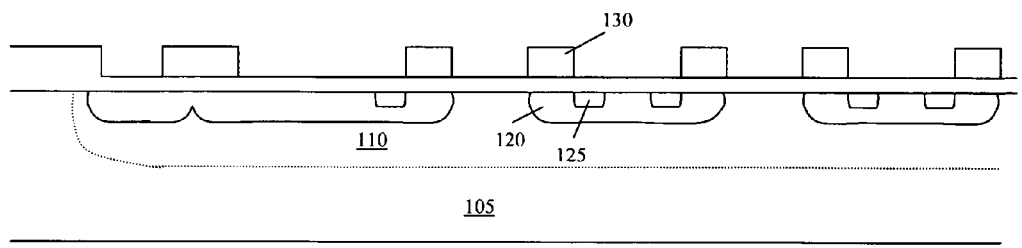
Figure 7E:
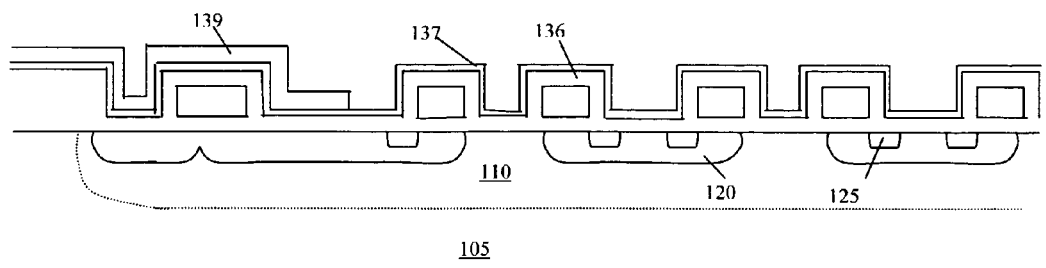
Figure 7F:
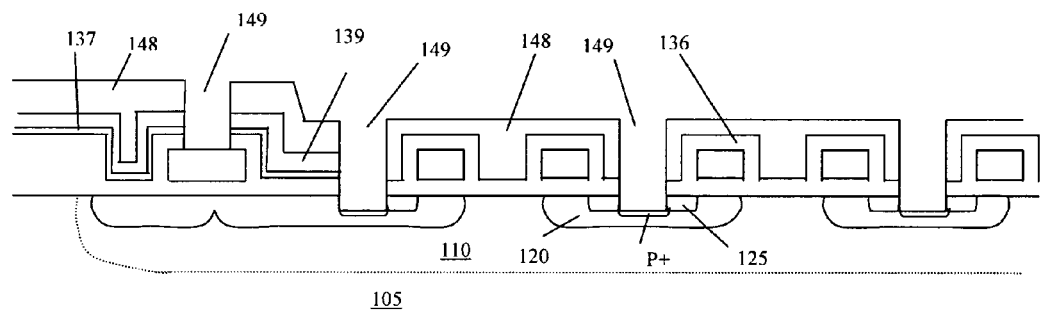
Figure 7G:
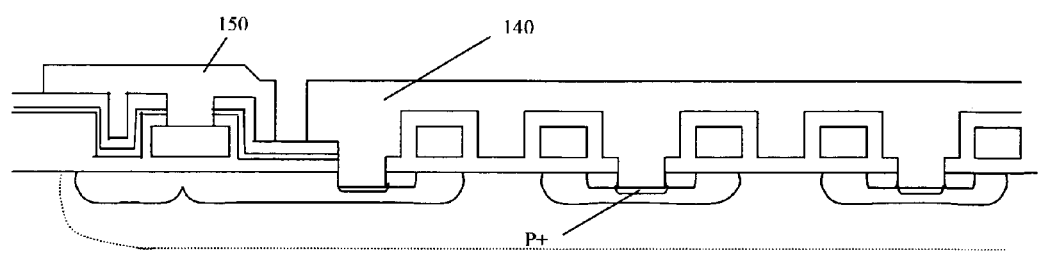
Figures 1, 7F:
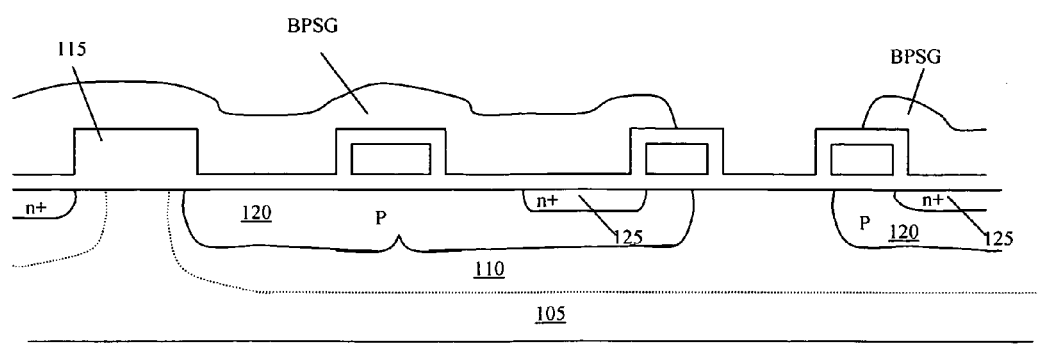
Figures 1, 7G:
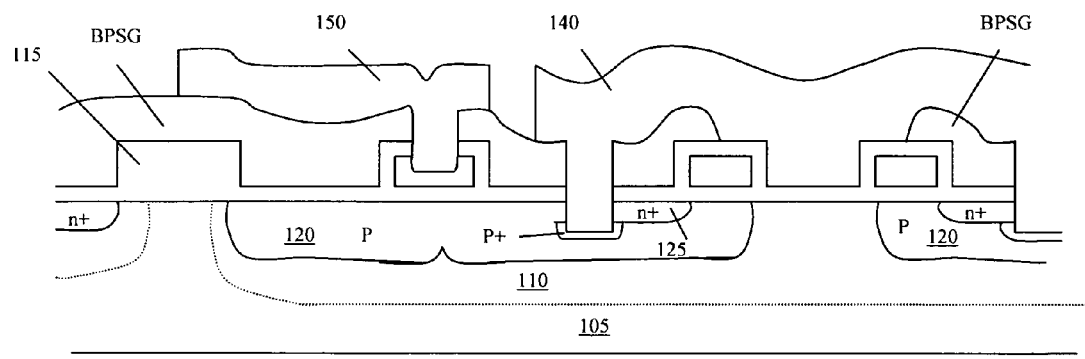

Referring to FIGS. 7A to 7G for an alternate "poly-first" process flow to fabricate a planar MOSFET of this invention. In FIG. 7A, the fabrication process starts by growing an initial oxide layer 115 on a top surface of N− Epi substrate 105. An active mask is applied to etch a portion of the oxide layer 115 to define an active area followed by an N ion JFET (junction field effect transistor) implant, e.g., an arsenic implant, and applying an elevate temperature to drive down the N region 110 into the substrate 105. In FIG. 7B, a gate oxide layer 135 is shown that is grown through the above diffusion process. Then, a polysilicon layer 130 is formed followed by applying a poly mask to define a plurality of polysilicon gate 130 on the top surface. In FIG. 7C, a body implant with P-type ions is carried out followed by a diffusion process for driving the P-body region 120 with an elevated temperature. The P-body implant is carried out with special body block to keep the body dopants out of the gap 134 in the poly layer 130. In FIG. 7D, a source mask is applied to carry out an N-type ion source implant followed by source diffusion to form the N+ source regions 125. Again, the source mask is specially configured to keep the source dopant out of the gaps 134 in the poly gates 130. In FIG. 7E, an oxide layer 136 is grown by thermal oxidation or low temperature deposition or combination of both, followed by deposition of a thin nitride layer less than 500 A serving as an etch stop layer 137. In one embodiment the nitride layer is 100-250 A. A thick layer of BPSG 139 is deposited on top of the nitride layer 137 followed by wet etch to remove the BPSG from the active area. In FIG. 7F, the nitride layer 137 is stripped followed by applying a contact mask 148 for carrying out a contact etch to pattern the contact openings 149. A contact implant is carried out. In FIG. 7G, a metal layer is deposited followed by applying a mask for etching and patterning a source metal 140 and gate metal 150. FIG. 7F-1 shows a variation of FIG. 7F where the BPSG is left over the active area contact region. That will lead to device with the structure as in FIG. 7G-2 as a variation from the structure shown in FIG. 7G.

In above-described processes, in order to round the top corner of the Poly gate electrode 130 to minimize gat-source leakage and maximize oxide rupture voltage, various techniques may be applied. These techniques may include the following options:

Pattern transfer to the Poly using a slope in the resist top corner

A small Isotropic etch of the Poly top corner, 2-5 times of the gate oxide thickness Use a 500 A oxide only top of the Poly. Subsequent source re-oxidation will round of the top corner of the Poly. This corner rounding allows the thinnest films to be used between gate and source, without degrading Vgsmax beyond the limit set by the gate oxide.

The oxide thickness between the gate and source electrode is accurately controlled using a sacrificial nitride process thus:

A controlled oxide is either grown during the body or source drive, or deposited on the wafer (or a combination).

This oxide is covered by a thin nitride layer.

If it is desirable to have BPSG covering the termination area for better reliability, that film is deposited next. A mask is applied and it is wet etched with HF, which leaves the nitride untouched.

The nitride may now be wet stripped from all the areas not covered with BPSG without affecting the well controlled thickness of the underlying oxide.

It may not be necessary to stripe the nitride, if it is made part of the dielectric stack.

Next, we proceed with the contact formation and metal deposition as in the other processes.

Given that both a nitride and BPSG film exist over the termination, it may now be possible to skip the passivation step.

Figure 8A:
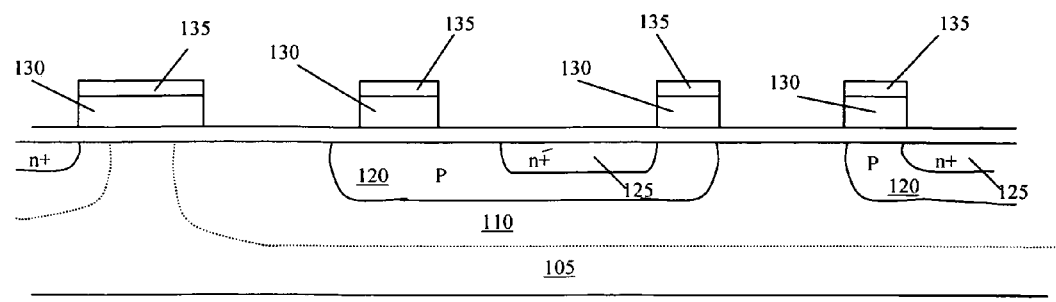
FIGS. 8A to 8C are a series of cross sectional views for illustrating alternate processes for manufacturing another alternate MOSFET device of this invention.
Figure 8B:
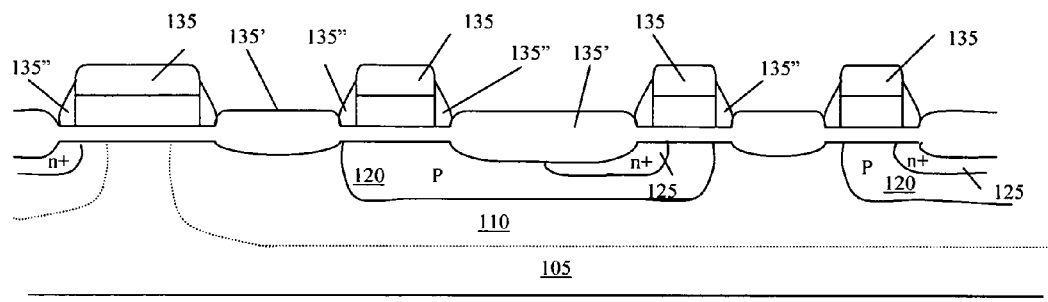
Figure 8C:
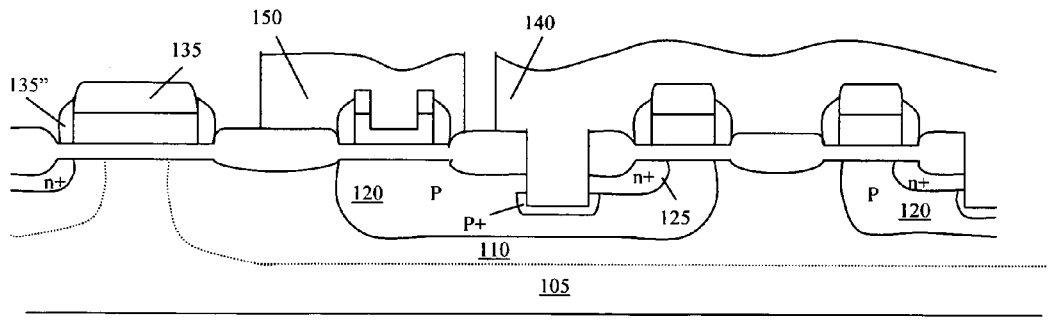

Referring to FIGS. 8A to 8C for an alternate "poly-last" process flow to fabricate a planar MOSFET of this invention. After completing the fabrication processes similar to that shown in FIGS. 5A to 5C, FIG. 8A shows a gate oxide layer 135 is first grown followed by depositing a polysilicon layer 130. The polysilicon layer 130 is patterned using an oxide hardmask 135. The oxide hardmask will be kept in place to reduce Ciss. In FIG. 8B, a thin oxide layer 135' is grown on the polysilicon sidewall to serve as the dielectric between the Poly and source-shielding plug. A nitride spacer 135" is formed by LPCVD deposition and etch back to protect the sidewall. A wet oxidation is performed to thicken the oxide layer 135 over the contact and between gate Poly areas 135" to the desired thickness. Then the spacer nitride 135" may be stripped, or if a greater thickness and reliability is desired, left in place. This nitride-oxide sequence can be skipped if the thin oxide grown is adequate for the design. In FIG. 8C, a contact mask is applied to etch and pattern the contact followed by the deposition and patterning of the metal layer as the processes as that described in FIG. 5E above. Clearly, most of these processing flows employed to keep a thin dielectric between the gate polysilicon openings over the drain epitaxial layer 110 and source electrode 140 penetrating between the opening etched in the center of the gate polysilicon for forming an effective Cgd shield can be transferred between the "Poly last" and "Poly first" process as described above.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A method for manufacturing a power MOSFET device comprising a step of forming a body region and a source region in a semiconductor substrate followed by depositing a gate layer on top of the semiconductor wherein said method further comprising:
   applying contact mask for patterning a plurality of gates with an interposing opening patterned in said gates for allowing a layer of source metal to interpose into said gates.

2. The method of claim 1 further comprising:
   depositing a metal layer over a plurality of patterned gates followed by a step applying a metal mask for patterning a gate metal and a source metal with said source layer interposing into said gates.

3. The method of claim 1 wherein:
   the step of forming a body and a source region in said semiconductor substrate further comprising a step of forming an epitaxial layer above said semiconductor substrate having a different dopant concentration than a drain region disposed on a bottom portion of said semiconductor substrate and forming said body region and source region in said epitaxial layer.

4. The method of claim 1 wherein:
   said step of forming said insulated gate electrode further comprising a step of forming an insulation layer for insulating said gate electrode from said source electrode with said insulation layer having a thickness depending on a Vgsmax rating of said MOSFET device.

5. The method of claim 1 wherein:
   said step of forming said insulated gate electrode further comprising a step of forming an insulation layer for insulating said gate electrode from said source electrode with said insulation layer having greater thickness surrounding an outer edges of said gate electrode for allowing an alignment tolerance for etching a contact opening.

6. The method of claim 1 wherein:
   the method for manufacturing a power MOSFET device further comprising a step of manufacturing said MOSFET device as an N-channel MOSFET cell.

* * * * *